United States Patent
Ha et al.

(10) Patent No.: US 12,120,904 B2
(45) Date of Patent: Oct. 15, 2024

(54) DISPLAY DEVICE AND METHOD OF MANUFACTURING THE SAME

(71) Applicant: SAMSUNG DISPLAY CO., LTD., Yongin-si (KR)

(72) Inventors: Jaeheung Ha, Suwon-si (KR); Jongwoo Kim, Hwaseong-si (KR); Changyeong Song, Suwon-si (KR); Woosuk Jung, Yongin-si (KR); Yongchan Ju, Yongin-si (KR); Heeyeon Park, Seoul (KR); Hyein Yang, Siheung-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 329 days.

(21) Appl. No.: 17/379,009

(22) Filed: Jul. 19, 2021

(65) Prior Publication Data
US 2022/0165983 A1 May 26, 2022

(30) Foreign Application Priority Data
Nov. 20, 2020 (KR) .................. 10-2020-0156631

(51) Int. Cl.
*H10K 50/844* (2023.01)
*H10K 71/00* (2023.01)

(52) U.S. Cl.
CPC .......... *H10K 50/844* (2023.02); *H10K 71/00* (2023.02)

(58) Field of Classification Search
None
See application file for complete search history.

(56) References Cited

U.S. PATENT DOCUMENTS

| | | | |
|---|---|---|---|
| 8,134,149 B2 | 3/2012 | Yamazaki et al. | |
| 9,548,339 B2 | 1/2017 | Jeong | |
| 9,790,396 B2 | 10/2017 | Klun et al. | |
| 10,361,393 B2 | 7/2019 | Kim et al. | |
| 10,718,987 B2 * | 7/2020 | Hosseini | G02F 1/133528 |
| 11,205,766 B2 | 12/2021 | Ha et al. | |
| 2004/0155154 A1 * | 8/2004 | Topping | G01K 11/14 374/E11.02 |
| 2005/0007937 A1 * | 1/2005 | Mori | G11B 7/24 |

(Continued)

FOREIGN PATENT DOCUMENTS

| | | | | |
|---|---|---|---|---|
| CN | 115224086 A | * | 10/2022 | H01L 27/156 |
| CN | 115707288 A | * | 2/2023 | H01L 33/382 |

(Continued)

OTHER PUBLICATIONS

Office Action dated May 22, 2024 corresponding to Korean Patent Application No. 10-2020-0156631 (in Korean), 12 pages.

*Primary Examiner* — Michael Lebentritt
(74) *Attorney, Agent, or Firm* — F. CHAU & ASSOCIATES, LLC

(57) ABSTRACT

A display device includes a substrate, a light emitting element disposed on the substrate, a capping layer covering the light emitting element, and an encapsulation layer disposed on the capping layer. The capping layer includes a first inorganic layer, a first flexible layer disposed on the first inorganic layer, and a second inorganic layer disposed on the first flexible layer. The first flexible layer includes silicon and carbon. A thickness of the first flexible layer is about 80% or more of a thickness of the capping layer.

20 Claims, 9 Drawing Sheets

(56) References Cited

U.S. PATENT DOCUMENTS

| | | | |
|---|---|---|---|
| 2008/0277765 A1* | 11/2008 | Lane | H01L 21/78 |
| | | | 257/E21.546 |
| 2018/0097200 A1 | 4/2018 | Park et al. | |
| 2018/0108867 A1 | 4/2018 | Lee et al. | |
| 2018/0151838 A1 | 5/2018 | Park et al. | |
| 2022/0131095 A1* | 4/2022 | Ko | H10K 85/6572 |
| 2023/0074124 A1* | 3/2023 | Shim | H10K 59/131 |

FOREIGN PATENT DOCUMENTS

| | | | |
|---|---|---|---|
| CN | 115707313 A * | 2/2023 | H01L 27/156 |
| JP | 2013-021301 | 1/2013 | |
| JP | 6951407 B2 * | 10/2021 | H01L 27/3218 |
| KR | 10-2016-0100026 A | 8/2016 | |
| KR | 10-2017-0067427 | 6/2017 | |
| KR | 10-2018-0018969 | 2/2018 | |
| KR | 10-2018-0078802 A | 7/2018 | |
| KR | 10-2018-0115655 A | 10/2018 | |
| KR | 10-2019-0074037 A | 6/2019 | |
| KR | 10-2020-0105618 A | 9/2020 | |
| WO | WO-2019235475 A1 * | 12/2019 | H01L 27/3209 |

\* cited by examiner

FIG. 4

| | THICKNESS(nm) | LIGHT EFFICIENCY | | | |
|---|---|---|---|---|---|
| | | RED | GREEN | BLUE | WHITE |
| REF. | 82 | 100 | 100 | 100 | 100 |
| CAPPING LAYER | 10 | 89.5 | 88.6 | 92.4 | 87.8 |
| | 20 | 88.1 | 87.2 | 92.8 | 86.6 |
| | 30 | 88.3 | 87.5 | 95.6 | 86.9 |
| | 40 | 90.0 | 89.6 | 100.4 | 89.0 |
| | 50 | 93.1 | 93.1 | 105.8 | 92.7 |
| | 60 | 97.4 | 97.4 | 110.0 | 97.2 |
| | 70 | 102.4 | 101.4 | 111.5 | 101.5 |
| | 80 | 107.1 | 104.1 | 110.1 | 104.4 |
| | 90 | 110.8 | 104.9 | 106.5 | 105.3 |
| | 100 | 112.8 | 104.0 | 102.0 | 104.3 |

FIG. 5

| | THICKNESS(nm) | WAD | | | |
|---|---|---|---|---|---|
| | | 0° | 15° | 30° | 45° |
| REF. | 82 | 0.000 | 0.003 | 0.009 | 0.017 |
| CAPPING LAYER | 10 | 0.000 | 0.002 | 0.005 | 0.014 |
| | 20 | 0.000 | 0.002 | 0.005 | 0.012 |
| | 30 | 0.000 | 0.002 | 0.004 | 0.009 |
| | 40 | 0.000 | 0.001 | 0.004 | 0.007 |
| | 50 | 0.000 | 0.001 | 0.004 | 0.007 |
| | 60 | 0.000 | 0.002 | 0.005 | 0.010 |
| | 70 | 0.000 | 0.002 | 0.007 | 0.015 |
| | 80 | 0.000 | 0.003 | 0.010 | 0.021 |
| | 90 | 0.000 | 0.003 | 0.012 | 0.026 |
| | 100 | 0.000 | 0.003 | 00013 | 0.030 |

DISPLAY DEVICE AND METHOD OF MANUFACTURING THE SAME

CROSS-REFERENCE TO RELATED APPLICATION

This application claims priority under 35 U.S.C. § 119 to Korean Patent Application No. 10-2020-0156631, filed on Nov. 20, 2020 in the Korean Intellectual Property Office, the disclosure of which is incorporated by reference for all purposes as if fully set forth herein.

BACKGROUND

Field

The present inventive concept relates to a display device and a method of manufacturing the display device.

Discussion of the Background

A display device may include a light emitting element that emits light by receiving an electrical signal. To increase the efficiency of light emitted from the light emitting element, the display device may include a capping layer disposed on the light emitting element, and the capping layer may be formed of an organic material.

Since the light emitting element is vulnerable to impurities such as gas and moisture, light efficiency of the light emitting element may be deteriorated due to impurities introduced into the display device from outside. To prevent the light efficiency from deteriorating due to impurities, an encapsulation layer may be formed on the light emitting element to isolate the light emitting element from outside. The encapsulation layer may include an organic layer and inorganic layers disposed above and below the organic layer, respectively.

Recently, a display device having a deformable shape such as a foldable display device or a stretchable display device has been implemented. Accordingly, if the structure of the encapsulation layer and the structure of the capping layer are not simplified, the encapsulation layer and the capping layer may be damaged due to deformation of the display device.

SUMMARY

Some embodiments provide a display device including a capping layer and an encapsulation layer having a simple structure applicable to a foldable display device or a stretchable display device.

Some embodiments provide a method of manufacturing a display device with improved process efficiency.

According to some embodiments of the present inventive concept, a display device may include a substrate, a light emitting element disposed on the substrate, a capping layer covering the light emitting element, and an encapsulation layer disposed on the capping layer. The capping layer may include a first inorganic layer, a first flexible layer disposed on the first inorganic layer, and a second inorganic layer disposed on the first flexible layer. The first flexible layer may include silicon and carbon. A thickness of the first flexible layer may be about 80% or more of a thickness of the capping layer.

According to some embodiments, each of a refractive index of the first inorganic layer, a refractive index of the first flexible layer, and a refractive index of the second inorganic layer may be about 1.75 or more.

According to some embodiments, a difference between a refractive index of the first inorganic layer and a refractive index of the first flexible layer may be about 0.15 or less, and a difference between the refractive index of the first flexible layer and a refractive index of the second inorganic layer may be about 0.15 or less.

According to some embodiments, the refractive index of the first inorganic layer may be larger than the refractive index of the first flexible layer, and the refractive index of the second inorganic layer may be larger than the refractive index of the first flexible layer.

According to some embodiments, the capping layer may have a thickness from about 50 nm to about 90 nm.

According to some embodiments, each of the first inorganic layer and the second inorganic layer may have a thickness from about 0.1 nm to 7.0 nm.

According to some embodiments, each of the first inorganic layer and the second inorganic layer may include $SiN_x$, and the first flexible layer comprises SiCN.

According to some embodiments, the encapsulation layer may include an organic encapsulation layer and an inorganic encapsulation layer disposed on the organic encapsulation layer, and a lower surface of the organic encapsulation layer may be in direct contact with an upper surface of the capping layer.

According to some embodiments, the capping layer may further include a second flexible layer disposed on the second inorganic layer, and a third inorganic layer disposed on the second flexible layer. The second flexible layer may include silicon and carbon. A sum of the thickness of the first flexible layer and a thickness of the second inorganic layer may be about 80% or more of the thickness of the capping layer.

According to some embodiments, the capping layer may have a thickness from about 50 nm to about 90 nm or less.

According to some embodiments, a difference of a refractive index of the first inorganic layer and a refractive index of the first flexible layer may be about 0.15 or less, a difference of the refractive index of the first flexible layer and a refractive index of the second inorganic layer may be 0.15 or less. A difference of the refractive index of the second inorganic layer a refractive index of the second flexible layer may be about 0.15 or less. A difference of the refractive index of the second flexible layer and a refractive index of the third inorganic layer may be about 0.15 or less.

According to some embodiments of the present disclosure, in a method of manufacturing a display device, the method may include forming a light emitting element on a substrate, forming a capping layer on the light emitting element, and forming an encapsulation layer on the capping layer. Forming the capping layer on the light emitting element may include forming a first inorganic layer, forming a first flexible layer on the first inorganic layer, forming a second inorganic layer on the first flexible layer. The first flexible layer may include silicon and carbon. A thickness of the first flexible layer may be about 80% or more of a thickness of the capping layer.

According to some embodiments, the first inorganic layer may be formed by first plasma enhanced atomic layer deposition (PEALD) using polysilane, the second inorganic layer may be formed by second PEALD using polysilane, and the first flexible layer may be formed by plasma enhanced chemical vapor deposition (PECVD) using polysilane.

According to some embodiments, a refractive index of the first inorganic layer may be determined by a first plasma power of the first PEALD, and a refractive index of the second inorganic layer may be determined by a second plasma power of the second PEALD.

According to some embodiments, a refractive index of the first flexible layer may be determined by a plasma power of the PECVD.

According to some embodiments, the capping layer may have a thickness from about 50 nm to about 90 nm.

According to some embodiments, forming the capping layer may further include forming a second flexible layer on the second inorganic layer, and forming a third inorganic layer on the second flexible layer. A sum of the thickness of the first flexible layer and a thickness of the second flexible layer may be about 80% or more of the thickness of the capping layer.

According to some embodiments, the second flexible layer may be formed by plasma enhanced chemical vapor deposition (PECVD) using polysilane, and the third inorganic layer may be formed by plasma enhanced atomic layer deposition (PEALD) using polysilane.

According to some embodiments, the capping layer may have a thickness from about 50 nm to about 90 nm.

According to some embodiments, forming the encapsulation layer may further include forming an organic encapsulation layer, and forming an inorganic encapsulation layer on the organic encapsulation layer. A lower surface of the organic encapsulation layer is in direct contact with an upper surface of the capping layer.

The display device may include the capping layer, and the thickness of the first flexible layer compared to the thickness of the capping layer may be about 80% or more. Accordingly, display device including the capping layer and the encapsulation layer having a simple structure applicable to a foldable display device or a stretchable display device may be provided.

The method of manufacturing a display device may include forming the capping layer on the light emitting element, forming the encapsulation layer on the capping layer. Forming the capping layer may include forming the first inorganic layer, forming the first flexible layer, and the second inorganic layer. Accordingly, the structure of the capping layer and the encapsulation layer may become simple, and the process of manufacturing of the display device may become simple.

BRIEF DESCRIPTION OF THE DRAWINGS

The accompanying drawings, which are included to provide a further understanding of the invention and are incorporated in and constitute a part of this specification, illustrate exemplary illustrative embodiments of the invention, and together with the description serve to explain the inventive concepts.

FIG. 4 is a table showing light efficiency according to the thickness of the capping layer of FIG. 1 of the present inventive concept.

FIG. 5 is a table showing WAD (white angular dependency) according to the thickness of the capping layer of FIG. 1 of the present inventive concept.

DETAILED DESCRIPTION

Hereinafter, embodiments of the present invention will be explained in detail with reference to the accompanying drawings.

Figure 1:
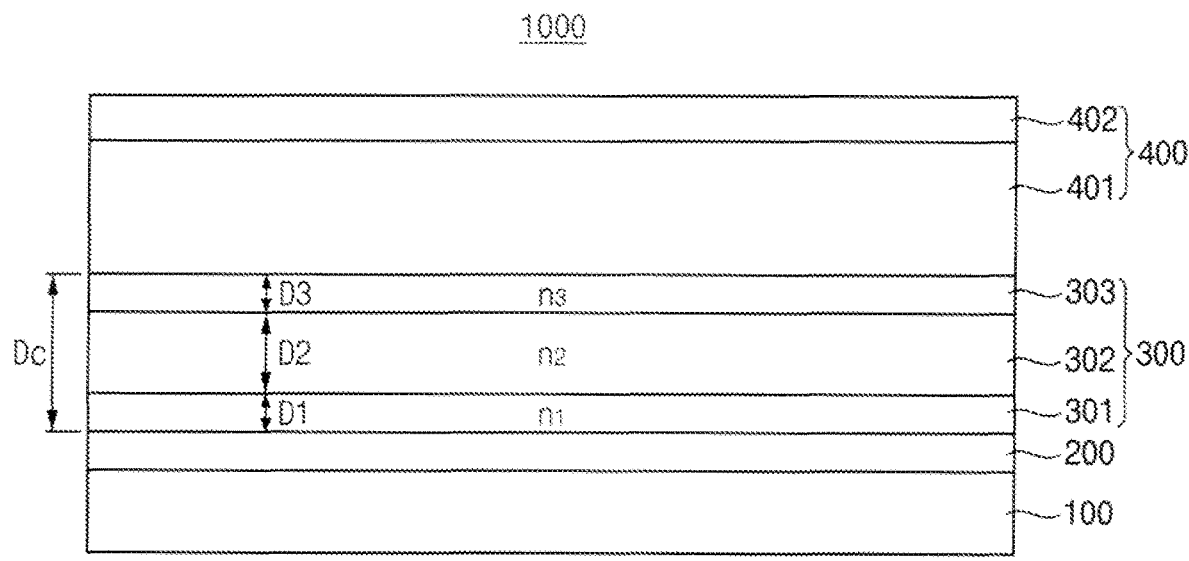
FIG. 1 is a diagram illustrating a stacked structure of a display device according to an embodiment of the present inventive concept.

FIG. 1 is a diagram illustrating a stacked structure of a display device according to an embodiment.

Referring to FIG. 1, a display device 1000 may include a substrate 100, a light emitting element 200, a capping layer 300, and an encapsulation layer 400.

The substrate 100 may include or may be formed of glass, quartz, plastic, or a polymer material. In an embodiment, the substrate 100 may be a flexible substrate including polyimide (PI).

The light emitting element 200 may be disposed on the substrate 100. The light emitting element 200 may include any structure capable of receiving an electric signal and emitting light having a luminance corresponding to the electric signal. For example, the light emitting element 200 may include or may be formed of an organic light emitting element (OLDE), a quantum dot light emitting element, etc. Light efficiency of the light emitting element 200 may be degraded by impurities such as gas and moisture. In an embodiment, the light efficiency of the light emitting element 200 may be defined as the ratio of the total light power to the total power. The light efficiency may be visible light efficiency of the light emitting element 200 in which the light refers to that in the visible region and the total power is that consumed by the light emitting element 200.

The capping layer 300 may cover the light emitting element 200. The capping layer 300 may increase an efficiency of light emitted from the light emitting element 200. In addition, the capping layer 300 may isolate the light emitting element 200 from impurities such as gas and moisture.

The capping layer 300 may include or may be formed of a first inorganic layer 301, a first flexible layer 302 disposed on the first inorganic layer 301, and a second inorganic layer 303 disposed on the first flexible layer 302.

The first inorganic layer 301 may include or may be formed of an inorganic material. For example, the first inorganic layer 301 may include or may be formed of $SiN_x$. The first inorganic layer 301 may serve as a seed layer in which the first flexible layer 302 is disposed. Also, the first inorganic layer 301 may isolate the light emitting element 200 from external impurities.

The first flexible layer 302 may include or may be formed of silicon and carbon. For example, the first flexible layer 302 may include SiCN. A degree of ductility of the first flexible layer 302 may be greater than each of a degree of ductility of the first inorganic layer 301 and a degree of ductility of the second inorganic layer 303.

The second inorganic layer 303 may include or may be formed of an inorganic material. For example, the second inorganic layer 303 may include or may be formed of $SiN_x$. The second inorganic layer 303 may serve as a passivation layer. The second inorganic layer 303 may prevent the first flexible layer 302 and the encapsulation layer 400 from directly contacting. In addition, the second inorganic layer 303 may isolate the light emitting element 200 from external impurities.

A thickness of the first inorganic layer 301 may be a first thickness D1, and a refractive index of the first inorganic layer 301 may be a first refractive index $n_1$. A thickness of the first flexible layer 302 may be a second thickness D2, and a refractive index of the first flexible layer 302 may be a second refractive index $n_2$. A thickness of the second inorganic layer 303 may be a third thickness D3, and a refractive index of the second inorganic layer 303 may be a third refractive index $n_3$. A thickness Dc of the capping layer 300 may be a sum of the first thickness D1, the second thickness D2 and the third thickness D3.

The second thickness D2 may be about 80% or more of the thickness Dc of the capping layer 300. In an embodiment, the second thickness D2 may be a thickness from about 90% to about 98% of the thickness Dc of the capping layer 300. Accordingly, even if the substrate 100 is folded or stretched, the capping layer 300 is not damaged or fractured.

The encapsulation layer 400 may be disposed on the capping layer 300. The encapsulation layer 400 may cover the capping layer 300. The encapsulation layer 400 may isolate the light emitting element 200 from external impurities.

In one embodiment, the encapsulation layer 400 may include or may be formed of an organic encapsulation layer 401 and an inorganic encapsulation layer 402. The inorganic encapsulation layer 402 may be disposed on the organic encapsulation layer 401. The organic encapsulation layer 401 may include or may be formed of an organic material, and the inorganic encapsulation layer 402 may include or may be formed of an inorganic material. The inorganic encapsulation layer 402 may isolate the light emitting element 200 from external impurities. An upper surface of the organic encapsulation layer 401 may be a flat surface. A refractive index of the organic encapsulation layer 401 may have a value from about 1.4 to about 1.5.

A lower surface of the organic encapsulation layer 401 may be in direct contact with an upper surface of the capping layer 300. For example, the lower surface of the organic encapsulation layer 401 may be in direct contact with an upper surface of the second inorganic layer 303.

Figure 2:
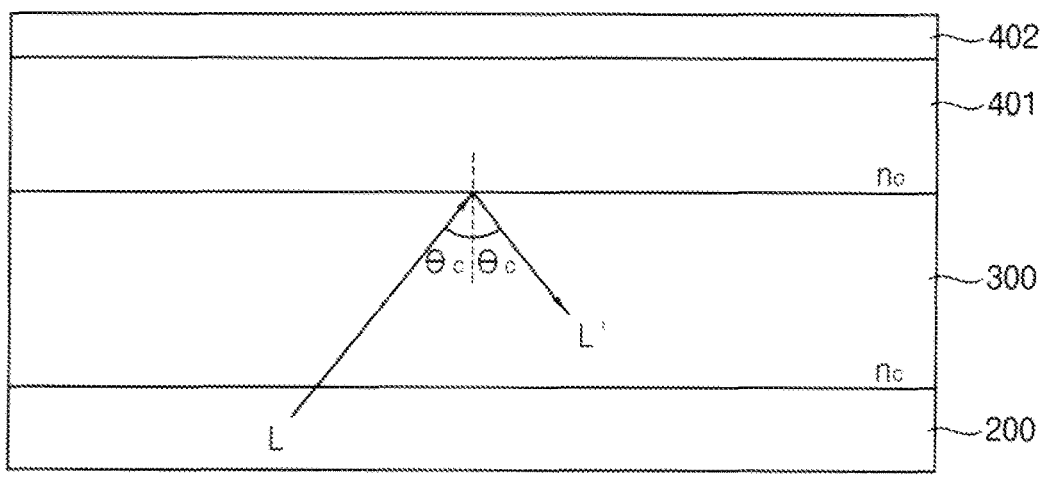
FIG. 2 is a diagram illustrating a part of the display device of FIG. 1 of the present inventive concept.

FIG. 2 is a diagram illustrating a part of the display device of FIG. 1.

Referring to FIG. 2, the light emitting element 200 may emit a light L. The light L may pass through the capping layer 300 and enter the interface between the capping layer 300 and the organic encapsulation layer 401. When an incident angle of the light L incident to the interface between the capping layer 300 and the organic layer 401 is greater than the critical angle $\theta_c$, total reflection of the light L may occur. In this case, the light L may be completely reflected at the interface between the organic encapsulation layer 401 and the capping layer 300.

The critical angle $\theta_c$ may increase as the difference between a refractive index $n_c$ of the capping layer 300 and a refractive index $n_o$ of the organic encapsulation layer 401 increases. For example, as the refractive index $n_c$ of the capping layer 300 is greater than the refractive index $n_o$ of the organic encapsulation layer 401, the amount of a reflected light L' may increase.

The reflected light L' may resonate with the light L emitted from the light emitting element 200. Accordingly, light efficiency may be increased.

The refractive index $n_c$ of the capping layer 300 may be about 1.75 or more. In an embodiment, each of the first refractive index $n_1$ of the first inorganic layer 301, the second refractive index $n_2$ of the first flexible layer 302, and the third refractive index $n_3$ of the second inorganic layer 303 may be about 1.75 or more. Accordingly, at the interface between the capping layer 300 and the organic encapsulation layer 401, the total amount of the reflected light L' is increased, and the light efficiency may be increased. In an embodiment, the critical angle $\theta_c$ may increase as the difference between a refractive index $n_3$ of the second inorganic layer 303 of the capping layer 300 and the refractive index $n_o$ of the organic encapsulation layer 401 increases. For example, as the refractive index $n_3$ of the second inorganic layer 303 is greater than the refractive index $n_o$ of the organic encapsulation layer 401, the amount of a reflected light L' may increase.

Figure 3:
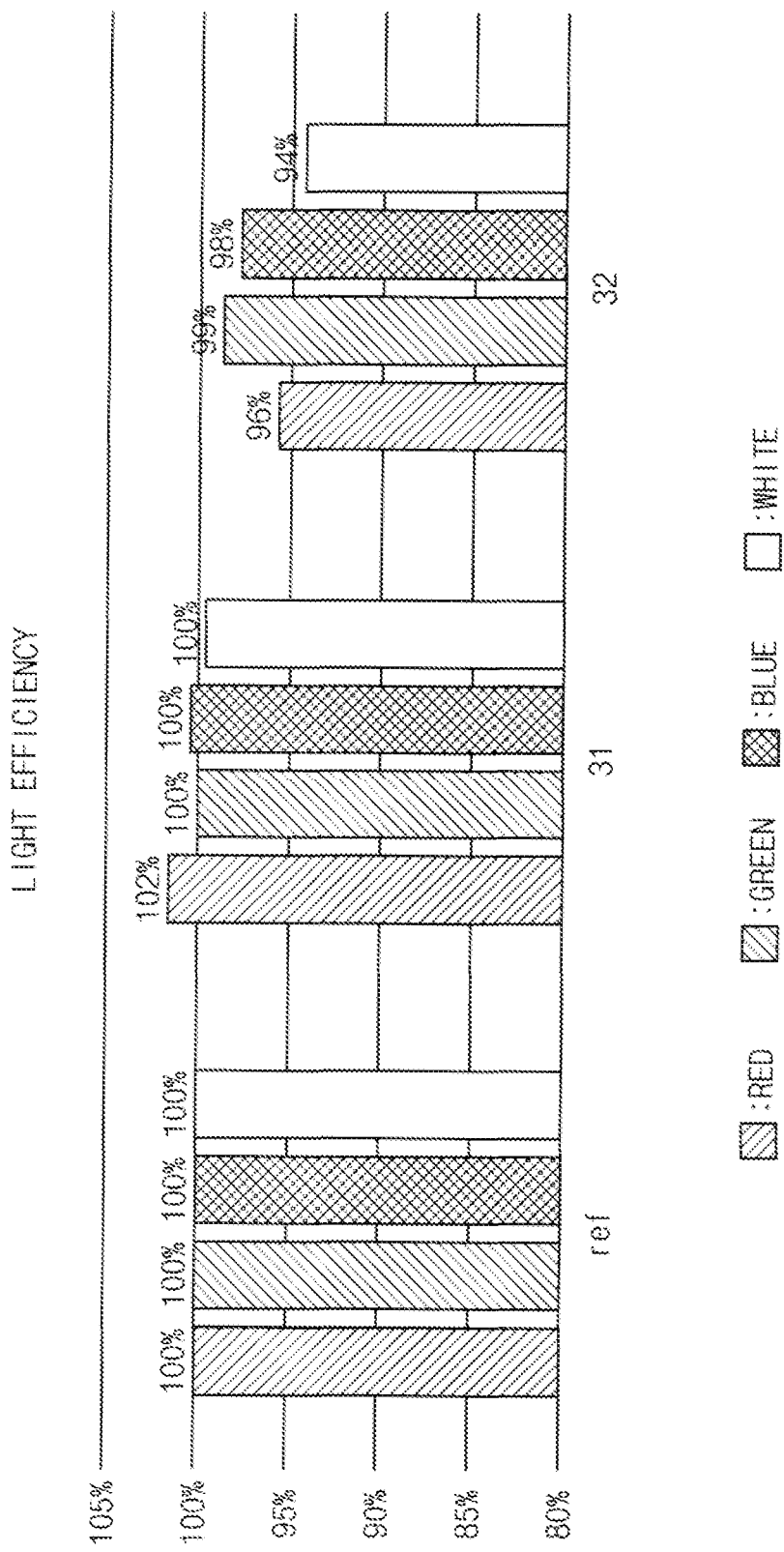
FIG. 3 is a graph showing light efficiency according to the refractive index of the capping layer of FIG. 1 of the present inventive concept.

FIG. 3 is a graph showing light efficiency according to the refractive index of the capping layer of FIG. 1.

Referring to FIG. 3, the graph of FIG. 3 represents light efficiency of light passing through the capping layer 300. In an embodiment, the light efficiency of the light emitting element 200 may be affected by the capping layer 300 or the interface between the capping layer 300 and the encapsulation layer 400. Light efficiency of red, green, blue, and white light in the comparative example REF is set to 100%, and light efficiency of each of the first and second experimental examples 31 and 32 is shown compared to the comparative example REF. Comparative example REF shows the light efficiency of light passing through the organic capping layer having a thickness of about 70 nm and a refractive index of about 1.9.

Experimental conditions of the first experimental example 31 are shown in Table 1.

TABLE 1

|  | First inorganic layer 301 | First flexible layer 302 | Second inorganic layer 303 |
| --- | --- | --- | --- |
| Thickness | 7 nm | 56 nm | 7 nm |
| Constituent material | $SiN_x$ | SiCN | $SiN_x$ |
| Refractive index | 1.9 | 1.75 | 1.9 |

Experimental conditions of the second experimental example 32 are shown in Table 2.

TABLE 2

|  | First inorganic layer 301 | First flexible layer 302 | Second inorganic layer 303 |
| --- | --- | --- | --- |
| Thickness | 7 nm | 56 nm | 7 nm |
| Constituent material | $SiN_x$ | SiCN | $SiN_x$ |
| Refractive index | 1.9 | 1.70 | 1.9 |

Referring to the first experimental example 31, when a difference between the first refractive index $n_1$ of the first inorganic layer 301 and the second refractive index $n_2$ of the first flexible layer 302 is about 0.15, and a difference between the third refractive index $n_3$ of the second inorganic layer 303 and the second refractive index $n_2$ of the first flexible layer 302 is about 0.15, light efficiency of light passing through the capping layer 300 may be equal to or higher than the light efficiency of comparative example REF. For example, in experimental conditions of the first experimental example 31, red light passing through the capping layer 300 exhibits light efficiency of about 102% of the light efficiency of the comparative example REF, and each of green, blue and white light passing through the capping layer 300 exhibits light efficiency of about 100% of the light efficiency of the comparative example REF.

Referring to the second experimental example 32, when a difference between the first refractive index $n_1$ of the first inorganic layer 301 and the second refractive index $n_2$ of the first flexible layer 302 is about 0.2, and a difference between the third refractive index $n_3$ of the second inorganic layer 303 and the second refractive index $n_2$ of the first flexible layer 302 is about 0.2, light efficiency of light passing through the capping layer 300 may be lower than the light efficiency of comparative example REF. For example, in experimental conditions of the second experimental example 32, red light passing through the capping layer 300 exhibits light efficiency of about 96% of the light efficiency of the comparative example REF, green light passing through the capping layer 300 exhibits light efficiency of about 99% of the light efficiency of the comparative example REF, blue light passing through the capping layer 300 exhibits light efficiency of about 98% of the light efficiency of the comparative example REF, and white light passing through the capping layer 300 exhibits light efficiency of about 94% of the light efficiency of the comparative example REF.

In one embodiment, a difference between the first refractive index $n_1$ of the first inorganic layer 301 and the second refractive index $n_2$ of the first flexible layer 302 may be about 0.15 or less, and a difference between the third refractive index $n_3$ of the second inorganic layer 303 and the second refractive index $n_2$ of the first flexible layer 302 may be about 0.15 or less. In addition, the first refractive index $n_1$ of the first inorganic layer 301 may be greater than the second refractive index $n_2$ of the first flexible layer 302, and the third refractive index $n_3$ of the second inorganic layer 303 may be greater than the second refractive index $n_2$ of the first flexible layer 302. Accordingly, light efficiency of the capping layer 300 may be equal to or higher than light efficiency of an organic capping layer having a same thickness as the thickness Dc of the capping layer 300.

FIG. 4 is a table showing light efficiency according to the thickness of the capping layer of FIG. 1. FIG. 5 is a table showing WAD (white angular dependency) according to the thickness of the capping layer of FIG. 1.

Referring to FIG. 4, a table of FIG. 4 sets the efficiency of red, green, blue, and white light in a comparative example REF to 100%, and light efficiency of the capping layer 300 is shown compared to the comparative example REF. The comparative example REF shows light efficiency of light passing through an organic capping layer having a thickness of about 82 nm.

When the thickness Dc of the capping layer 300 is about 40 nm, light efficiency of red light passing through the capping layer is about 90% of the light efficiency of the comparative example REF, light efficiency of green light passing through the capping layer is about 89.6% of the light efficiency of the comparative example REF, light efficiency of blue light passing through the capping layer is about 100.4% of the light efficiency of the comparative example REF, and light efficiency of white light passing through the capping layer is about 89.0% of the light efficiency of the comparative example REF.

Light efficiency of light passing through the capping layer 300 when the thickness Dc of the capping layer 300 is less than about 40 nm is lower than light efficiency of light passing through the capping layer 300 when the thickness of the capping layer 300 is about 40 nm. As the thickness Dc of the capping layer 300 is smaller than about 40 nm, light efficiency of light passing through the capping layer 300 is lowered.

When the thickness Dc of the capping layer 300 is about 50 nm, light efficiency of red light passing through the capping layer 300 is about 93.1% of the light efficiency of the comparative example REF, light efficiency of green light passing through the capping layer 300 is about 93.1% of the light efficiency of the comparative example REF, light efficiency of blue light passing through the capping layer is about 105.8% of the light efficiency of the comparative example REF, and light efficiency of white light passing through the capping layer 300 is about 92.7% of the light efficiency of the comparative example REF.

Light efficiency of light passing through the capping layer 300 when the thickness Dc of the capping layer 300 is greater than about 50 nm is higher than light efficiency of light passing through the capping layer 300 when the thickness Dc of the capping layer 300 is about 50 nm. As the thickness Dc of the capping layer 300 is greater than about 50 nm, light efficiency of light passing through the capping layer 300 is increased.

Referring to FIG. 5, a table of FIG. 5 shows WAD according to the thickness Dc of the capping layer 300 of FIG. 1. When a light emitting element emits white light, white light is recognized from the front, but blue, green, and red lights rather than white light may be recognized from the side. WAD refers to a degree to which blue, green, and red lights rather than white light are recognized from the side of the light emitting element that emits white light.

When the thickness Dc of the capping layer 300 is about 100 nm, WAD at about 45° is about 0.030. Accordingly, blue, green, and red lights rather than white light may be recognized from the side of a display device.

Referring to FIG. 4, and FIG. 5, in one embodiment, the thickness Dc of the capping layer 300 may have a value from about 50 nm to about 90 nm. When the thickness DC of the capping layer 300 has a value from about 50 nm to about 90 nm, the first thickness D1 of the first inorganic layer 301 may have a value from about 0.1 nm to about 7.0 nm, and the third thickness D3 of the second inorganic layer 303 may have a value from about 0.1 nm to about 7.0 nm. When the thickness Dc of the capping layer 300 is more than 50 nm, light efficiency of light passing through the capping layer 300 may be greater than about 90% of the light efficiency of the comparative example REF. When the thickness Dc of the capping layer 300 is about 90 nm or less, WAD at an angle from about 0° to about 45° may be about 0.3 or less. Accordingly, when the thickness Dc of the capping layer 300 has a value from about 50 nm to 90 nm, light efficiency of light passing through the capping layer 300 may be greater than 90% of the light efficiency of the comparative example REF, and WAD at an angle from about 0° to about 45° may be about 0.3 or less.

A sum of the second thickness D2 and the fourth thickness D4 may be about 80% or more of the thickness Dc' of the capping layer 300'. For example, the sum of the second thickness D2 and the fourth thickness D4 may have a value from about 90% to about 98% of the thickness Dc' of the capping layer 300'.

Figure 6:
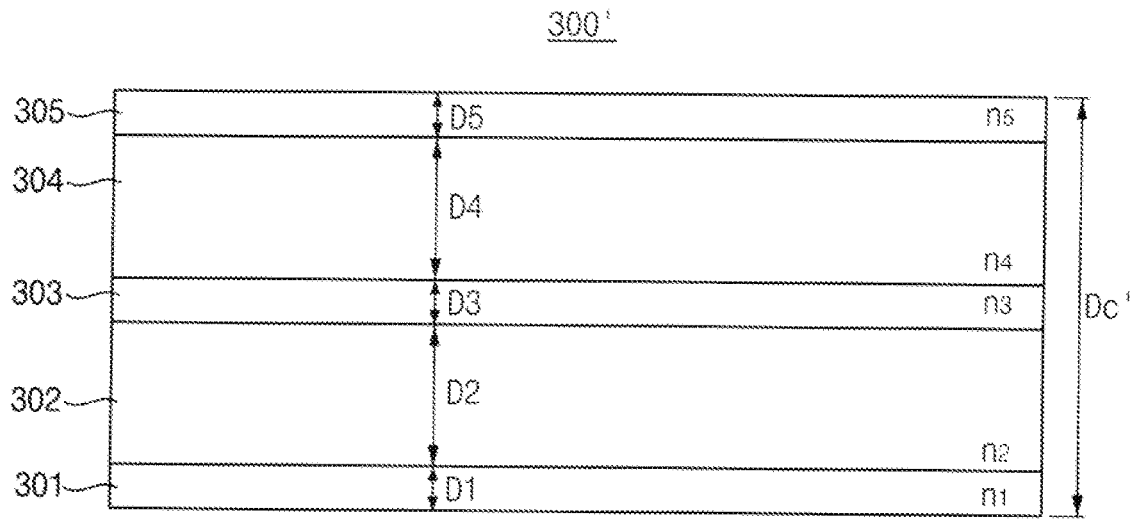
FIG. 6 is a diagram illustrating another embodiment of the capping layer of FIG. 1 of the present inventive concept.

FIG. 6 is a diagram illustrating another embodiment of the capping layer of FIG. 1.

Referring to FIG. 6, a capping layer 300' may include or may be formed of a first inorganic layer 301, a first flexible layer 302 disposed on the first inorganic layer 301, a second inorganic layer 303 disposed on the first flexible layer 302, a second flexible layer 304 disposed on the second inorganic layer 303, and a third inorganic layer 305 disposed on the second flexible layer 304.

Each of the first inorganic layer 301, the second inorganic layer 303, and the third inorganic layer 305 may include or may be formed of an inorganic material. For example, each of the first inorganic layer 301, the second inorganic layer 303, and the third inorganic layer 305 may include or may be formed of $SiN_x$.

Each of the first flexible layer 302 and the second flexible layer 304 may include or may be formed of carbon and silicon. For example, each of the first flexible layer 302 and the second flexible layer 304 may include or may be formed of SiCN.

A thickness of the first inorganic layer 301 may be a first thickness D1, and a refractive index of the first inorganic layer 301 may be a first refractive index $n_1$. A thickness of the first flexible layer 302 may be a second thickness D2, and a refractive index of the first flexible layer 302 may be a second refractive index $n_2$. A thickness of the second inorganic layer 303 may be a third thickness D3, and a refractive index of the second inorganic layer 303 may be a third refractive index $n_3$. A thickness of the second flexible layer may be a fourth thickness D4, and a refractive index of the second flexible layer may be a fourth refractive index $n_4$. A thickness of the third inorganic layer 305 may be a fifth thickness D5, and a refractive index of the third inorganic layer 305 may be a refractive index $n_5$. A thickness Dc' of the capping layer 300' may be a sum of the first thickness D1, the second thickness D2, the third thickness D3, the fourth thickness D4, and the fifth thickness D5.

The thickness Dc' of the capping layer 300' may have a value from about 50 nm to about 90 nm. When the thickness Dc' of the capping layer 300' has a value from about 50 nm to about 90 nm, light efficiency of the capping layer 300' may be relatively high. And, when the thickness Dc' of the capping layer 300' has a value from about 50 nm to about 90 nm, WAD of the capping layer 300' may be relatively low.

A difference between the first refractive index $n_1$ and the second refractive index $n_2$ may be about 0.15 or less, a difference between the second refractive index $n_2$ and the third refractive index $n_3$ may be about 0.15 or less, a difference between the third refractive index $n_3$ and the fourth refractive index $n_4$ may be about 0.15 or less, and a difference between the fourth refractive index $n_4$ and the fifth refractive index $n_5$ may be 0.15 or less. The first refractive index $n_1$ may be greater than second refractive index $n_2$, the second refractive index $n_2$ may be lower than the third refractive index $n_3$, the third refractive index $n_3$ may be greater than the fourth refractive index $n_4$, and the fourth refractive index $n_4$ may be lower than the fifth refractive index $n_5$. Accordingly, light efficiency of the capping layer 300' may be equal to or greater than light efficiency of the organic capping layer having a same thickness as the thickness Dc' of the capping layer 300'.

Figure 7:
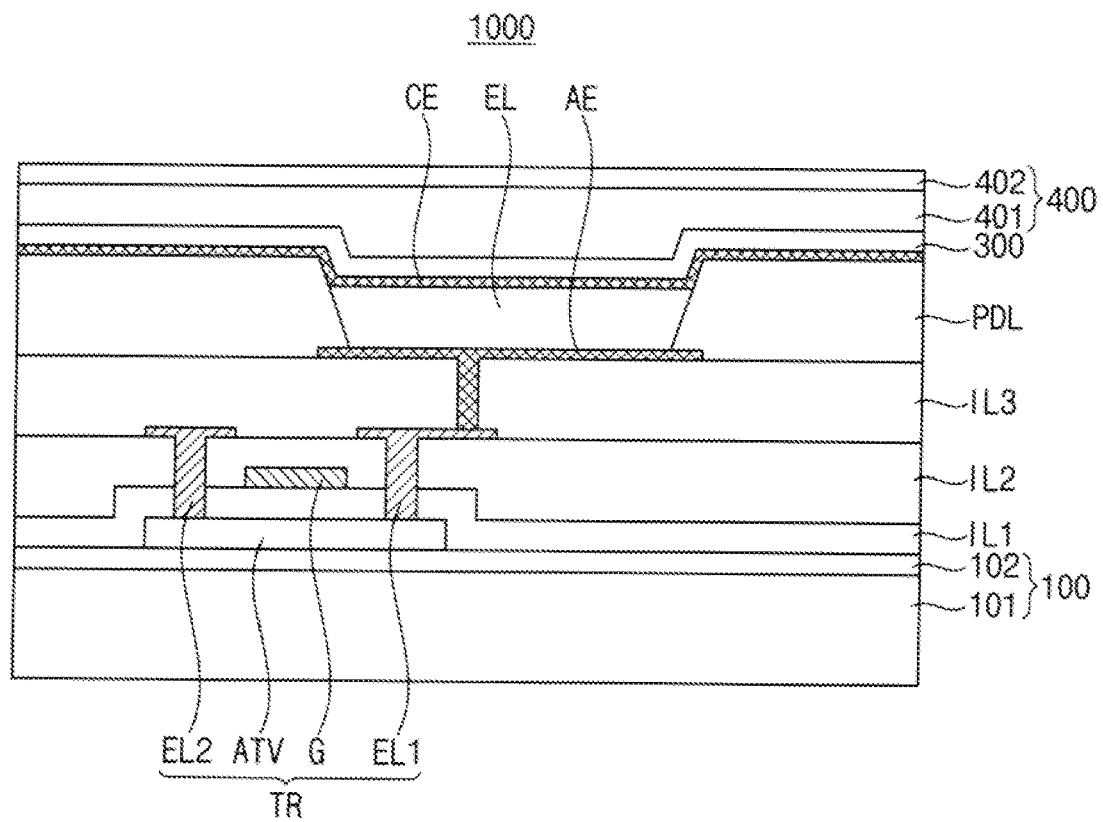
FIG. 7 is a schematic cross-sectional view of a display device according to an embodiment of the present inventive concept.

FIG. 7 is a schematic cross-sectional view of a display device according to an embodiment.

Referring to FIG. 7, a display device 1000 may include a substrate 100, a transistor TR, a first insulating layer ILL a second insulating layer IL2, a third insulation layer IL3, a pixel defining layer PDL, an anode electrode AE, a light emitting layer EL, a cathode electrode CE, a capping layer 300, and an encapsulation layer 400. The transistor may include an active layer ATV, a first electrode EL1, a second electrode EL2, and a gate electrode G.

The substrate 100 may include a base substrate 101, and a buffer layer 102 disposed on the base substrate 101. The base substrate 101 may include or may be formed of glass, plastic, polymer material, etc. The base substrate 101 may be a flexible substrate including or being formed of a polyimide (PI). The buffer layer 102 may block impurities such as gas and moisture existing in the base substrate 101. The buffer layer 102 may include or may be formed of an inorganic insulating material such as silicon oxide, silicon nitride, silicon oxynitride, etc.

The active layer ATV may be disposed on the buffer layer 102. The active layer ACT may include or may be formed of polycrystalline silicon, amorphous silicon, or oxide semiconductor.

The first insulating layer IL1 may be disposed on the active layer ATV. The first insulating layer IL1 may cover the active layer ATV and may be disposed on the buffer layer 102. The first insulating layer IL1 may insulate the gate electrode G disposed on the active layer ATV from the active layer ATV.

The gate electrode G may be disposed on the first insulating layer IL1. The gate electrode G may include or may be formed of a conductive material.

The second insulating material IL2 may be disposed on the gate electrode G. The second insulating material IL2 may cover the gate electrode G and may be disposed on the first insulating layer IL1. The second insulating layer IL2 may insulate the first electrode EL1 and the second electrode EL2 disposed on the gate electrode G from the gate electrode G.

The first electrode EL1 and the second electrode EL2 may be disposed on the second insulating layer IL2. The first electrode EL1 and the second electrode EL2 may be electrically coupled with the active layer ATV. For example, the first electrode EL1 may contact a first side of the active layer ATV through a contact hole formed in the first insulating layer IL1 and the second insulating layer. For example, the second electrode EL2 may contact a second side, opposite to the first side, of the active layer ATV through a contact hole formed in a first insulating layer IL1 and the second insulating layer.

The third insulating layer IL3 may be disposed on the first electrode EL1 and the second electrode EL2. The third insulating layer IL3 may cover the first electrode EL1 and the second electrode EL2 and may be disposed on the second insulating layer IL2. An upper surface of the third insulating layer IL3 may be flat.

The anode electrode AE may be disposed on the third insulating layer IL3. The anode electrode AE may include or may be formed of a conductive material. The anode electrode AE may be electrically coupled with the first electrode EL1. For example, the anode electrode AE may contact an upper surface of the first electrode EL1 through a contact hole formed in the third insulating layer IL3.

The pixel defining layer PDL may be disposed on the anode electrode AE. The pixel defining layer PDL may cover the anode electrode and may be disposed on the third insulating layer IL3. The pixel defining layer PDL may include a pixel opening exposing at least a part of the anode electrode AE. For example, the pixel opening may expose a central part of the anode electrode AE, and the pixel defining layer PDL may cover a peripheral part of the anode electrode AE.

The light emitting layer EL may be disposed on the anode electrode AE. The light emitting layer EL may be disposed on the anode electrode AE exposed by the pixel opening. The light emitting layer EL may include or may be formed of an organic light emitting material, a quantum dot light emitting material, etc. The light emitting layer EL may receive an electric signal from the transistor TR through the anode electrode AE. The light emitting layer EL may emit light having luminance corresponding to intensity of the electric signal.

The cathode electrode CE may be disposed on the light emitting layer EL. The cathode electrode CE may be disposed on the pixel defining layer PDL.

The capping layer 300 may be disposed on the cathode electrode CE. The capping layer 300 may cover the cathode electrode CE. The capping layer 300 may increase light efficiency of light emitted from the light emitting layer EL. The capping layer 300 may block impurities such as gas and moisture from outside. The capping layer 300 may be substantially same as the capping layer 300 described with reference to FIGS. 1 to 5 or the capping layer 300' described with reference to FIG. 6.

The encapsulation layer 400 may be disposed on the capping layer 300. The encapsulation layer 400 may include or may be formed of an organic encapsulation layer 401 and an inorganic encapsulation layer 402 disposed on the organic encapsulation layer 401. An upper surface of the organic encapsulation layer 401 may be flat. The organic encapsulation layer 401 may provide a flat surface to the inorganic encapsulation layer 402. The inorganic encapsulation layer 402 may block impurities such as gas and moisture from outside.

FIG. 8A, FIG. 8B, FIG. 8C, FIG. 8D, and FIG. 8E are diagrams illustrating a method of manufacturing a display device according to an embodiment.

Figure 8A:
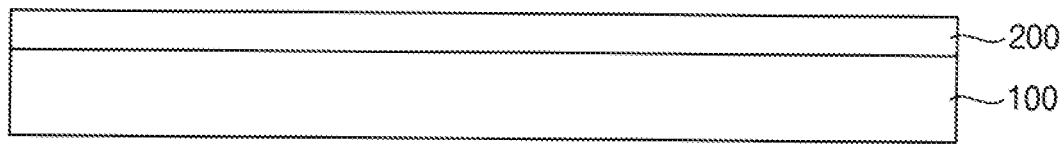
FIG. 8A, FIG. 8B, FIG. 8C, FIG. 8D, and FIG. 8E are diagrams illustrating a method of manufacturing a display device according to an embodiment of the present inventive concept.

Referring to FIG. 8A, a light emitting element 200 may be formed on a substrate 100. The substrate 100 may include or may be formed of glass, plastic, polymer material, etc. The substrate 100 may be a flexible substrate including polyimide (PI). The light emitting element 200 may include any structure capable of receiving an electric signal and emitting light having a luminance corresponding to the electric signal. For example, the light emitting element 200 may include the transistor TR, the first, second, and third insulation layer ILL IL2, and IL3, the pixel defining layer, the anode electrode AE, and the cathode electrode CE of FIG. 7.

Figure 8B:
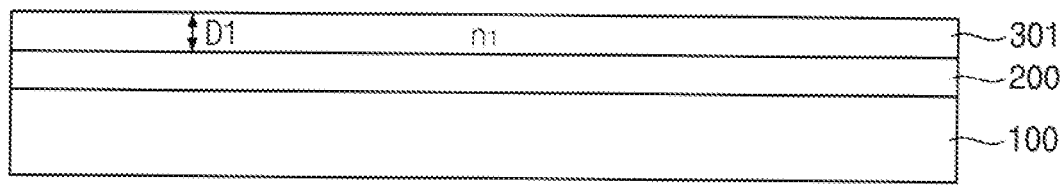

Referring to FIG. 8B, a first inorganic layer 301 may be formed on the light emitting element 200. The first inorganic layer 301 may cover the light emitting layer 200. A thickness of the first inorganic layer 301 may be a first thickness D1, and a refractive index of the first inorganic layer 301 may be a first refractive index $n_1$. The first inorganic layer 301 may include or may be formed of $SiN_x$. The first inorganic layer 301 may be formed by plasma enhanced atomic layer deposition (PEALD) using polysilane.

In one embodiment, the first inorganic layer 301 may be formed by PEALD using Bis(t-butylamino)silane BTBAS. For example, forming of the first inorganic layer 301 may include following steps in one cycle: forming a silicon film by PEALD by supplying BTBAS to a chamber, injecting argon gas to purge the BTBAS residue and impurities, supplying $NH_3$ or $N_2$ to the camber to form a $SiN_X$ film by PEALD, and injecting argon gas to purge the $NH_3$ residue, the $N_2$ residue, and impurities.

When the cycle is repeated several times, the first thickness D1 may be increased. For example, when the cycle is performed one time, the first thickness D1 may have a thickness from about 0.08 nm to about 1.3 nm. When the cycle is repeated five times, the first thickness D1 may be a thickness from about 0.4 nm to 6.5 nm.

When a plasma power of the PEALD is changed, the first refractive index $n_1$ may be changed. For example, when the plasma power is about 50 W, the first refractive index $n_1$ may be about 1.95. When the plasma power is about 200 W, the first refractive index $n_1$ may be about 2.05. When the plasma power is about 300 W, the first refractive index $n_1$ may be about 1.9.

In one embodiment, forming of the first inorganic layer 301 may further include adjusting the refractive index $n_1$ of the first inorganic layer 301. For example, by adjusting the plasma power within the cycle, the first refractive index $n_1$ may be adjusted.

Figure 8C:
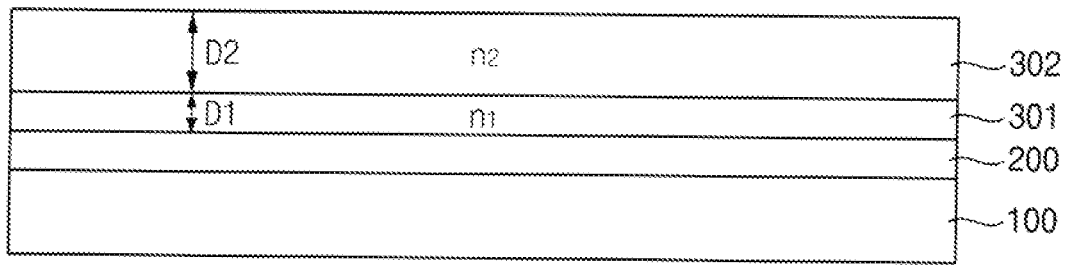

Referring to FIG. 8C, a first flexible layer 302 may be formed on the first inorganic layer 301. The first flexible layer 302 may cover the first inorganic layer 301 and the light emitting layer 200. A thickness of the first flexible layer 302 may be a second thickness D2, and a refractive index of the first flexible layer 302 may be a second refractive index $n_2$. The first flexible layer 302 may include or may be formed of silicon and carbon. The first flexible layer 302 may include or may be formed of SiCN. The first flexible layer 302 may be formed by plasma enhanced chemical vapor deposition (PECVD) using polysilane.

In one embodiment, the first flexible layer 302 may be formed by PECVD using BTBAS. For example, forming the first flexible layer 302 may include supplying BTBAS, $H_2$, and $NH_3$ to a chamber to form the first flexible layer 302 by PECVD.

When a process time of the PECVD is increased, the second thickness D2 may be increased. For example, when the process time is about 1 minute, the second thickness D2 may be a thickness from about 18 nm to about 41 nm. When the process time is about 3 minutes, the second thickness D2 may be a thickness from about 54 nm to about 123 nm.

When a plasma power of the PECVD is changed, the second refractive index $n_2$ may be changed. For example, when the plasma power is about 35 W, the second refractive index $n_2$ may be about 2. When the plasma power is about 50 W, the second refractive index $n_2$ may be about 1.7. When the plasma power is about 100 W, the second refractive index $n_2$ may be about 1.9.

In one embodiment, forming the first flexible layer 302 may further include adjusting the refractive index $n_2$ of the first flexible layer 302. For example, by adjusting the plasma power of the PECVD, the second refractive index $n_2$ may be adjusted.

Figure 8D:
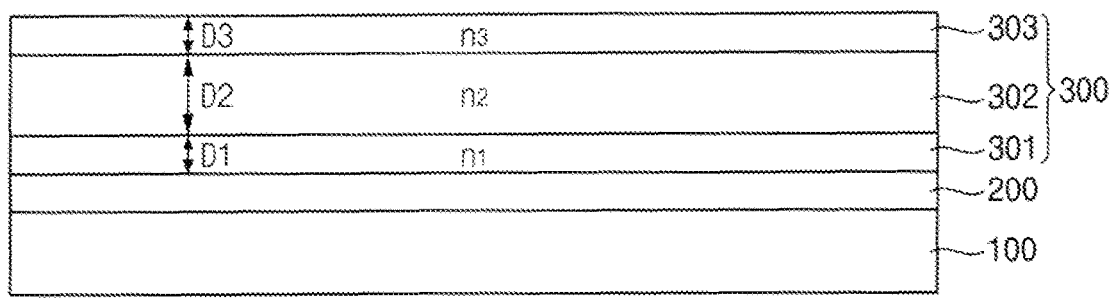

Referring to FIG. 8D, a second inorganic layer 303 may be formed on the first flexible layer 302. The second inorganic layer 303 may cover the first flexible layer 302, the first inorganic layer 301, and the light emitting element 200. A thickness of the second inorganic layer 303 may be a third thickness D3, and a refractive index of the second inorganic layer 303 may be a third refractive index $n_3$. The second inorganic layer 303 may include or may be formed of $SiN_x$. The second inorganic layer 303 may be formed by PEALD.

In one embodiment, the second inorganic layer 303 may be formed by PEALD using BTBAS. For example, forming of the second inorganic layer 303 may include following steps in one cycle: forming a silicon film by PEALD by supplying BTBAS to a chamber, injecting argon gas to purge the BTBAS residue and impurities, supplying $NH_3$ or $N_2$ to the camber to form a $SiN_x$ film by PEALD, and injecting argon gas to purge the $NH_3$ residue, the $N_2$ residue, and impurities.

When the cycle is repeated several times, the third thickness D3 may be increased. When a plasma power of the PEALD is changed, the first refractive index $n_3$ may be changed. In one embodiment, forming of the second inorganic layer 303 may further include adjusting the third refractive index $n_3$.

Figure 8E:
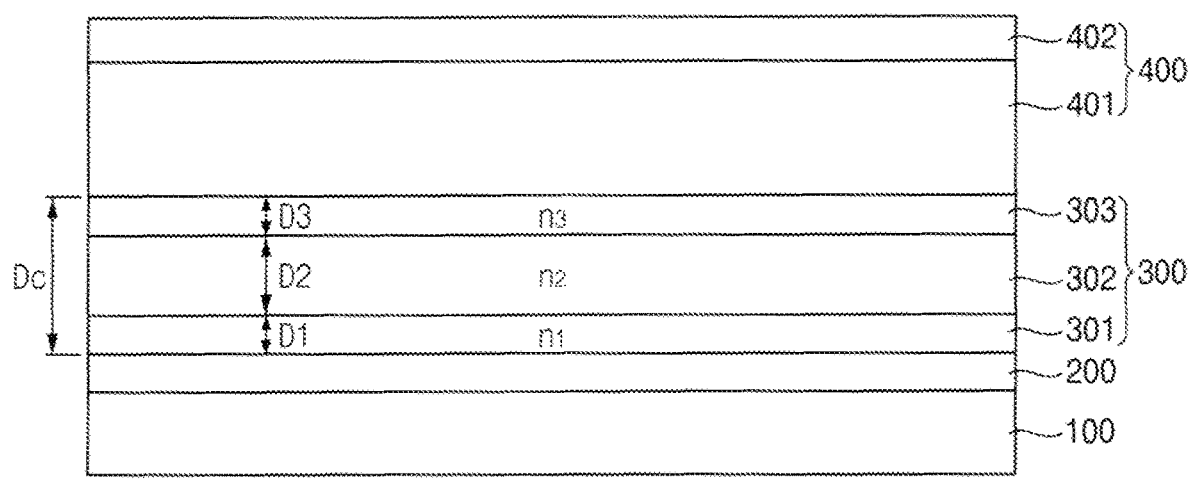

Referring to FIG. 8E, an encapsulation layer 400 may be formed on the capping layer. Forming the encapsulation layer 400 may include forming an organic encapsulation layer 401 on the capping layer 300, and forming an inorganic encapsulation layer 402 on the organic encapsulation layer 401. In the process of forming of the organic encapsulation layer 401, a lower surface of the organic encapsulation layer 401 may be in direct contact with an upper surface of the capping layer 300. For example, the lower surface of the organic encapsulation layer 401 may be in direct contact with an upper surface of the second inorganic layer 300. The organic encapsulation layer 401 may be substantially same as the organic encapsulation layer 401 of FIGS. 1 to 7. The inorganic encapsulation layer 402 may be substantially same as the inorganic encapsulation layer 402 of FIGS. 1 to 7.

Referring to FIGS. 8B to 8E, the capping layer 300 may be formed on the light emitting element 200. Forming the capping layer 300 may include forming the first inorganic layer 301 on the light emitting element 200, forming the first flexible layer 302 on the first inorganic layer 301, and forming the second inorganic layer 303 on the first flexible layer 302. The capping layer 300 may cover the light emitting element 200. A thickness Dc of the capping layer 300 may be a sum of the first thickness D1, the second thickness D2, and the third thickness D3. The second thickness D2 may be about 80% or more of the thickness Dc of the capping layer 300. For example, the second thickness D2 may be 90% or more and 98% or less of the thickness Dc of the capping layer 300.

In one embodiment, the thickness Dc of the capping layer 300 may be a thickness from about 50 nm to about 90 nm. Accordingly, the capping layer 300 may have relatively high light efficiency and relatively low WAD.

Figure 9:
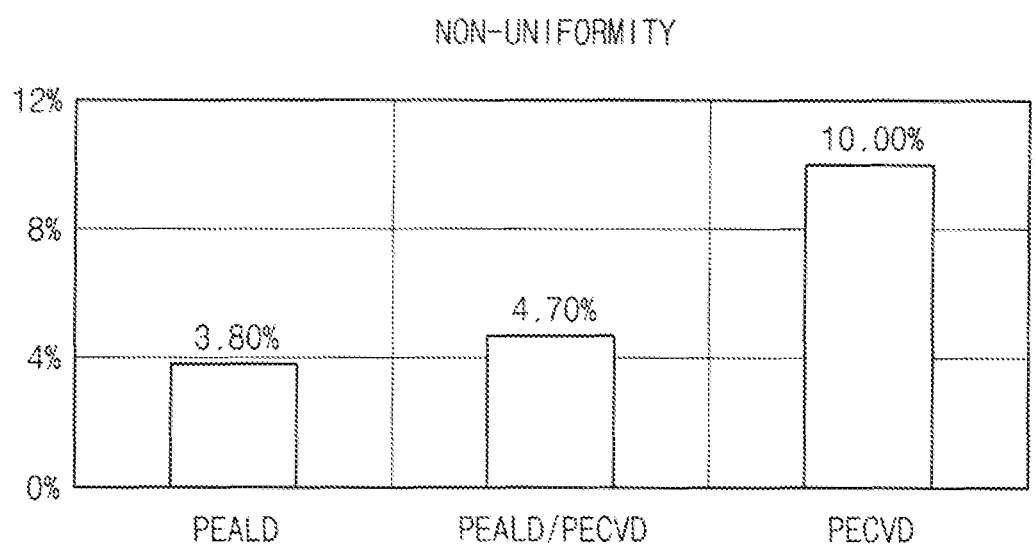
FIG. 9 is a graph showing non-uniformity of a capping layer formed by PEALD and/or PECVD of the present inventive concept.

FIG. 9 is a graph showing non-uniformity of a capping layer formed by PEALD, PECVD or a combination thereof.

Referring to FIG. 9, non-uniformity of a thickness (i.e., surface roughness) a capping layer formed by PEALD may be about 3.8%, and non-uniformity of a capping layer formed by PECVD may be about 10.0%. The non-uniformity of the capping layer formed by PEALD may be lower than the non-uniformity of the capping layer formed by PECVD. Accordingly, an upper surface of the capping layer formed by PEALD may be flatter than an upper surface of the capping layer formed by PECVD. A process yield of PEALD may be lower than a process yield of PECVD.

When a capping layer is formed by PECVD on a seed layer formed by PEALD, non-uniformity of a thickness (i.e. a surface roughness) of the capping layer formed by PEALD and PECVD may be about 4.7%. In this case, a process time required to form the capping layer may be relatively reduced.

In one embodiment, the first inorganic layer 301 may be formed by PEALD, the first flexible layer 302 may be formed by PECVD, and the second inorganic layer 303 may be formed by PECVD. Accordingly, a process time required to form the capping layer 300 may be relatively reduced, and non-uniformity of the capping layer 300 may be relatively reduced.

Figure 10A:
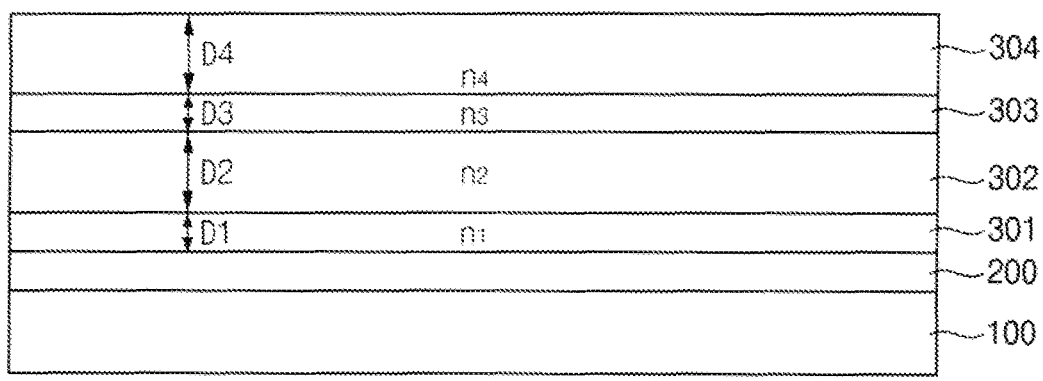
FIG. 10A and FIG. 10B are diagrams illustrating a method of manufacturing a capping layer according to an embodiment of the present inventive concept.
Figure 10B:
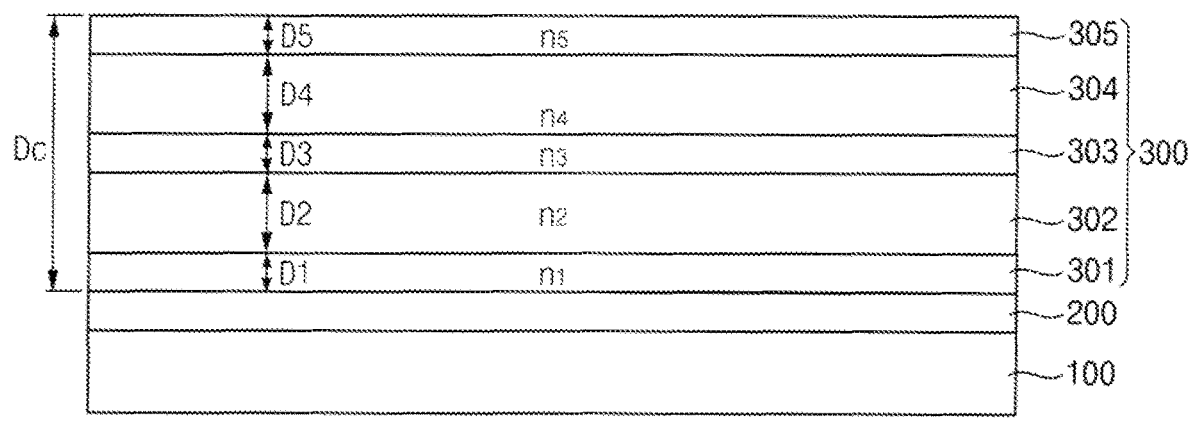

FIG. 10A, and FIG. 10B are diagrams illustrating a method of manufacturing a capping layer according to an embodiment.

Referring to FIG. 10A, a first inorganic layer 301 may be formed on a light emitting element 200, a first flexible layer 302 may be formed on the first inorganic layer 301, a second inorganic layer 303 may be formed on the first flexible layer 302, and a second flexible layer 304 may be formed on the second inorganic layer 303. Steps of forming the first inorganic layer 301, the first flexible layer 302, and the second inorganic layer 303 may be substantially the same as the steps described with reference to FIGS. 8B to 8D.

The second flexible layer 304 may cover the second inorganic layer 303, the first flexible layer 302, the first inorganic layer 301, and the light emitting element 200. A thickness of the second flexible layer 304 may be a fourth thickness D4, and a refractive index of the second flexible layer 304 may be a fourth refractive index $n_4$. The second flexible layer 304 may include or may be formed of silicon and carbon. The second flexible layer 304 may include or may be formed of SiCN. The second flexible layer 304 may be formed by PECVD using polysilane. Forming the second flexible layer 304 may include forming the second flexible layer 304 by PECVD using BTBAS. The fourth thickness D4 and the fourth refractive index $n_4$ may be adjusted by adjusting a process condition of PECVD.

Referring to FIG. 10B, a third inorganic layer 305 may be formed on the second flexible layer 304. The third inorganic layer 305 may cover the second flexible layer 304, the second inorganic layer 303, the first flexible layer 302, the first inorganic layer 301, and the light emitting layer 200. A thickness of the third inorganic layer 305 may be a fifth thickness D5, and a refractive index of the third inorganic layer 305 may be a fifth refractive index $n_5$. The third inorganic layer 305 may be formed by PEALD using polysilane. Forming the third inorganic layer 305 may include forming the third inorganic layer 305 by PEALD using BTBAS. The fifth thickness D5 and the fifth refractive index $n_5$ may be adjusted by adjusting a process condition of PEALD.

A thickness Dc of the capping layer 300 may be a sum of the first thickness D1, the second thickness D2, the third thickness D3, the fourth thickness D4, and the fifth thickness D5. A sum of the second thickness D2 and the fourth thickness D4 may be about 80% or more of the thickness Dc of the capping layer 300. For example, the sum of the second thickness D2 and the fourth thickness D4 may be a thickness from about 90% to about 98% of the thickness Dc of the capping layer 300.

In one embodiment, the thickness Dc of the capping layer 300 may be a thickness from about 50 nm to about 90 nm. Accordingly, the capping layer 300 may have relative high light efficiency and relative low WAD.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
   a substrate;
   a light emitting element disposed on the substrate;

a capping layer covering the light emitting element; and
an encapsulation layer disposed on the capping layer,
wherein the capping layer comprises:
  a first inorganic layer;
  a first flexible layer disposed on the first inorganic layer, the first flexible layer including silicon and carbon; and
  a second inorganic layer disposed on the first flexible layer,
wherein a thickness of the first flexible layer is about 80% or more of a thickness of the capping layer.

2. The display device of claim 1,
wherein each of a refractive index of the first inorganic layer, a refractive index of the first flexible layer, and a refractive index of the second inorganic layer is about 1.75 or more.

3. The display device of claim 1,
wherein a difference between a refractive index of the first inorganic layer and a refractive index of the first flexible layer is about 0.15 or less, and
a difference between the refractive index of the first flexible layer and a refractive index of the second inorganic layer is about 0.15 or less.

4. The display device of claim 3,
wherein the refractive index of the first inorganic layer is larger than the refractive index of the first flexible layer, and
the refractive index of the second inorganic layer is larger than the refractive index of the first flexible layer.

5. The display device of claim 1,
wherein the capping layer has a thickness from about 50 nm to about 90 nm.

6. The display device of claim 5,
wherein each of the first inorganic layer and the second inorganic layer has a thickness from about 0.1 nm to about 7.0 nm.

7. The display device of claim 1,
wherein each of the first inorganic layer and the second inorganic layer comprises SiNx, and
wherein the first flexible layer comprises SiCN.

8. The display device of claim 1,
wherein the encapsulation layer comprises an organic encapsulation layer and an inorganic encapsulation layer disposed on the organic encapsulation layer, and
wherein a lower surface of the organic encapsulation layer is in direct contact with an upper surface of the capping layer.

9. The display device of claim 1,
wherein the capping layer further comprises:
a second flexible layer disposed on the second inorganic layer, the second flexible layer comprising silicon and carbon; and
a third inorganic layer disposed on the second flexible layer, and
wherein a sum of the thickness of the first flexible layer and a thickness of the second flexible layer is about 80% or more of the thickness of the capping layer.

10. The display device of claim 9,
wherein the capping layer has a thickness from about 50 nm to about 90 nm.

11. The display device of claim 9,
wherein a difference of a refractive index of the first inorganic layer and a refractive index of the first flexible layer is about 0.15 or less,
wherein a difference of the refractive index of the first flexible layer and a refractive index of the second inorganic layer is about 0.15 or less,
wherein a difference of the refractive index of the second inorganic layer and a refractive index of the second flexible layer is about 0.15 or less, and
wherein a difference of the refractive index of the second flexible layer and a refractive index of the third inorganic layer is about 0.15 or less.

12. A method of manufacturing a display device, the method comprising:
forming a light emitting element on a substrate;
forming a capping layer on the light emitting element; and
forming an encapsulation layer on the capping layer,
wherein forming the capping layer on the light emitting element comprises:
  forming a first inorganic layer;
  forming a first flexible layer on the first inorganic layer, the first flexible layer including silicon and carbon; and
  forming a second inorganic layer on the first flexible layer,
wherein a thickness of the first flexible layer is about 80% or more of a thickness of the capping layer.

13. The method of claim 12,
wherein the first inorganic layer is formed by first plasma enhanced atomic layer deposition (PEALD) using polysilane,
wherein the second inorganic layer is formed by second PEALD using polysilane, and
wherein the first flexible layer is formed by plasma enhanced chemical vapor deposition (PECVD) using polysilane.

14. The method of claim 13,
wherein a refractive index of the first inorganic layer is determined by a first plasma power of the first PEALD, and
wherein a refractive index of the second inorganic layer is determined by a second plasma power of the second PEALD.

15. The method of claim 13,
wherein a refractive index of the first flexible layer is determined by a plasma power of the PECVD.

16. The method of claim 12,
wherein the capping layer has a thickness from about 50 nm to about 90 nm.

17. The method of claim 12,
wherein forming the capping layer further comprises:
forming a second flexible layer on the second inorganic layer; and
forming a third inorganic layer on the second flexible layer, and
wherein a sum of the thickness of the first flexible layer and a thickness of the second flexible layer is about 80% or more of the thickness of the capping layer.

18. The method of claim 17,
wherein the second flexible layer is formed by plasma enhanced chemical vapor deposition (PECVD) using polysilane, and
wherein the third inorganic layer is formed by plasma enhanced atomic layer deposition (PEALD) using polysilane.

19. The method of claim 17,
wherein the capping layer has a thickness from about 50 nm to about 90 nm.

20. The method of claim 12,
wherein forming the encapsulation layer further comprises:

forming an organic encapsulation layer; and
forming an inorganic encapsulation layer on the organic encapsulation layer, and
wherein a lower surface of the organic encapsulation layer is in direct contact with an upper surface of the capping layer.

* * * * *